(12) United States Patent
Ichihara et al.

(10) Patent No.: US 8,054,074 B2
(45) Date of Patent: Nov. 8, 2011

(54) ATOMIC MAGNETOMETER AND MAGNETIC FORCE MEASURING METHOD

(75) Inventors: Sunao Ichihara, Kawasaki (JP); Natsuhiko Mizutani, Tokyo (JP); Hideyuki Sugioka, Ebina (JP); Tetsuo Kobayashi, Kyoto (JP); Kiyoshi Ishikawa, Kyoto (JP); Shuji Taue, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

(21) Appl. No.: 12/409,789

(22) Filed: Mar. 24, 2009

(65) Prior Publication Data

US 2009/0243610 A1 Oct. 1, 2009

(30) Foreign Application Priority Data

Mar. 26, 2008 (JP) ................. 2008-081278

(51) Int. Cl.
*G01V 3/00* (2006.01)
(52) U.S. Cl. .................. 324/304; 324/305; 324/301
(58) Field of Classification Search .................. 324/304, 324/305, 301, 300
See application file for complete search history.

(56) References Cited

U.S. PATENT DOCUMENTS

| | | | | |
|---|---|---|---|---|
| 4,209,746 | A | 6/1980 | Abramov et al. | 324/301 |
| 5,189,368 | A * | 2/1993 | Chase | 324/304 |
| 5,254,947 | A * | 10/1993 | Chaillout et al. | 324/304 |
| 6,472,869 | B1 * | 10/2002 | Upschulte et al. | 324/304 |
| 7,038,450 | B2 | 5/2006 | Romalis et al. | 324/304 |
| 7,061,237 | B2 | 6/2006 | Pines et al. | 324/304 |
| 7,521,928 | B2 * | 4/2009 | Romalis et al. | 324/304 |
| 7,863,894 | B2 * | 1/2011 | Hall | 324/307 |

OTHER PUBLICATIONS

J. C. Allred et al., "High-Sensitivity Atomic Magnetometer Unaffected by Spin-Exchange Relaxation", *Physical Review Letters*, vol. 89, No. 13, Sep. 23, 2002, pp. 130801-130804.
S.-K. Lee et al., "Subfemtotesla Radio-Frequency Atomic Magnetometer for Detection of Nuclear Quadrupole Resonance", *Applied Physics Letters* 89, pp. 214106-1-214106-3.
I. M. Savukov et al., "NMR Detection with an Atomic Magnetometer", *Physical Review Letters*, Apr. 1, 2005, PRL 94, pp. 123001-123004.
S. I. Kanorsky et al., "Quantitative Investigation of the Resonant Nonlinear Faraday Effect Under Conditions of Optical Hyperfine Pumping", *Physical Review A*, vol. 47. No. 2, Feb. 1993, pp. 1220-1226.
V. Acosta et al., "Nonlinear Magneto-Optical Rotation with Frequency-Modulated Light in the Geophysical Field Range", *Physical Review A*, vol. 73, (2006), pp. 053404-1-053404-8.
I. K. Kominis et al., "A Subfemtotesla Multichannel Atomic Magnetometer", *Nature* vol. 422, Apr. 10, 2003, pp. 596-599.

* cited by examiner

*Primary Examiner* — Louis Arana
(74) *Attorney, Agent, or Firm* — Fizpatrick, Cella, Harper & Scinto

(57) ABSTRACT

An atomic magnetometer includes a cell containing an atomic group, a pump light source, a probe light source, a mirror, and a detector. The cell is disposed between the pump light source and the mirror and between the probe light source and the detector. A pump beam emitted from the pump light source is circularly polarized light. The pump beam passes through the cell and is reflected by the mirror and then passes through the cell again. The probe beam emitted from the probe light source is linearly polarized light. An optical path of the probe beam is parallel to the plane of incidence of the pump beam and is also parallel to the surface of the mirror. The optical path of the probe beam crosses the optical path of the pump beam in the cell. The probe beam which has passed through the cell enters the detector.

16 Claims, 6 Drawing Sheets

US 8,054,074 B2

ATOMIC MAGNETOMETER AND MAGNETIC FORCE MEASURING METHOD

FIELD OF THE INVENTION AND RELATED ART

The present invention relates to a magnetometer for measuring magnetic field strength or magnetic field gradient, specifically an atomic magnetometer utilizing the paramagnetic Faraday effect.

In recent years, high-sensitivity atomic magnetometers capable of measuring a magnetic field smaller than that of a superconducting quantum interface device (SQUID) by utilizing atomic spin have been proposed (U.S. Pat. No. 7,038, 450 and J. C. Allred et al., "High-Sensitivity Atomic Magnetometer Unaffected by Spin-Exchange Relaxation", Physical Review Letters, Vol. 89, No. 13, p. 130801, September 2002).

These atomic magnetometers include a cell containing an alkali metal gas, a light source for a pump beam (pump light source), and a light source for a probe beam (probe light source).

These atomic magnetometers are operated in the following manner. First, alkali metal gas in the cell is spin-located by a circularly polarized pump beam. When a linearly polarized probe beam enters the spin-polarized alkali metal gas, a polarization plane (plane of polarization) of the linearly polarized light is rotated.

Specifically, the probe beam is caused to enter in a direction perpendicular to the optical path of the pump beam. At this time, the polarization plane of the probe beam is rotated by an angle proportional to the magnitude of the magnetic field with respect to a direction perpendicular to the optical path of the probe beam and the optical path of the pump beam.

Such a rotation of the polarization plane is caused by a magneto-optical effect which is called paramagnetic Faraday rotation. By detecting the rotation angle (angle of rotation) of the paramagnetic Faraday rotation, an indirect magnetic field is measured.

Further, in S.-K. Lee et al., "Subfemtotesla Radio-Frequency Atomic Magnetometer for Detecting of Nuclear Quadrupole Resonance", Applied Physics Letters, Vol. 89, No. 21, p. 214106, November 2006, the pump beam is caused to enter the cell from both sides of the cell in the above-described atomic magnetometer. As a result, the distribution of spin polarization degree of atoms can be uniformized, so that a high-frequency (RF) signal was measured.

In the above-described conventional atomic magnetometers, the noise level is decreased with a longer spin relaxation time, so that detection sensitivity of the magnetic field is improved.

The relaxation time is longer with increased spin polarization and with a magnetic field in the measuring area closer to zero magnetic field. Therefore, it is preferable that the degree of the atomic spin polarization is increased and that magnetic noise in the measuring area, such as terrestrial magnetism, is removed.

In the conventional atomic magnetometers described above, in the case where the optical path of the pump beam and the optical path of the probe beam do not cross each other at right angles, the influence thereof is outputted as a signal and is mixed with an output signal in magnetic field detection. That is, the DC component of the signal generated due to non-orthogonality between the pump beam and the probe beam and the DC component of a signal generated from the magnetic field in the measuring area cannot be discriminated. For that reason, it is difficult to distinguish the presence of the magnetic noise from the output signal, so that it is very difficult to remove the magnetic noise. For this reason, conventional atomic magnetometers have been accompanied by a problem that the sensitivity to magnetic field detection is lowered.

When the optical path of the pump beam and that of the probe beam are caused accurately to cross each other at right angles, the problem can be solved, but it is very difficult to cross the optical paths of the pump beam and the probe beam with each other at right angles.

SUMMARY OF THE INVENTION

In view of the above-described problem, a principal object of the present invention is to provide an atomic magnetometer capable of detecting a magnetic field with high sensitivity.

Another object of the present invention is to provide a magnetic force measuring method using the atomic magnetometer.

According to an aspect of the present invention is provided an atomic magnetometer comprising:
a cell containing an atomic group;
a light source for emitting a probe beam including a linearly polarized light so that the probe beam passes through the cell;
a detector for detecting a rotation angle of a polarization plane of the probe beam which has passed through the cell;
a light source for emitting a pump beam for spin-polarizing a plurality of atoms constituting the atomic group so that the pump beam crosses an optical path of the probe beam in the cell; and
a first mirror for reflecting the pump beam so that the pump beam which has passed through the cell crosses again the optical path of the probe beam in the cell.

According to another aspect of the present invention is provided a magnetic force measuring method comprising:
preparing an atomic magnetometer including a cell containing an atomic group, a light source for emitting a pump beam for spin-polarizing a plurality of atoms constituting the atomic group, a light source for emitting a probe beam including a linearly polarized light, a detector for detecting a rotation angle of a polarization plane of the probe beam, and at least one mirror placed in an optical path of the pump beam; and
passing the pump beam through the cell plural times by reflecting the pump beam by the at least one mirror so that the probe beam crosses the pump beam in the cell and then enters the detector.

According to the present invention, it is possible to detect the magnetic field with high sensitivity.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Hereinbelow, embodiments of the present invention will be described with reference to the drawings.

First Embodiment

Figure 1:
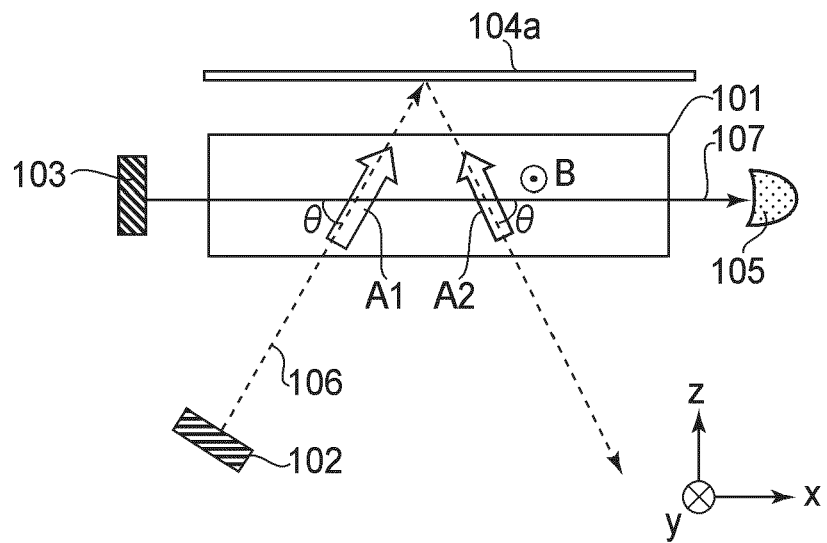
FIG. 1 is a schematic view showing an atomic magnetometer according to a general first embodiment of the present invention.

FIG. 1 is a schematic view showing an atomic magnetometer according to this embodiment.

The atomic magnetometer includes a cell 101 containing an atomic group (atoms), a light source for a pump beam (pump light source) 102, a light source for a probe beam (probe light source) 103, a first mirror 104a, and a detector 105.

The cell 101 is disposed between the pump light source 102 and the first mirror 104a and between the probe light source 103 and the detector 105. The first mirror 104a is placed in an optical path of the cell 101.

A pump beam 106 emitted from the pump light source 102 is circularly polarized light. The pump beam 106 passes through the cell 101 and is reflected by the first mirror 104a and then passes through the cell 101 again. In FIG. 1, the incident angle of the pump beam 106 with respect to the first mirror 104a is indicated as a large angle but actually the incident angle is small, so that the optical path of incident light and the optical path of reflected light can be constituted so as to overlap with each other substantially.

An angle θ shown in FIG. 1 is not particularly limited so long as the pump beam crosses the probe beam plural times in the cell 101 but is, e.g., 0.01 degree or more and 10 degrees or less.

The circularly polarized pump beam 106 can uniformize directions of spin of atoms constituting the atomic group in the cell 101 to spin-polarize the atoms. The wavelength of the pump beam 106 coincides with a resonance line of the atoms so that the atoms in the cell 101 can be spin-polarized.

A probe beam 107 emitted from the probe light source 103 is linearly polarized light. The wavelength of the probe beam 103 is detuned from the resonance line of the atoms so that the atoms of the atomic group are unnecessarily excited.

The optical path of the probe beam 107 is parallel to the plane of incidence of the pump beam 106 and is also parallel to the surface of the first mirror 104a (i.e., x-direction in FIG. 1). The optical path of the probe beam 107 crosses the pump beam 106 in the cell 101. The probe beam 107 which has passed through the cell 101 enters the detector 105.

Thus, the propagation direction of the pump beam 106 and the propagation direction of the probe beam 107 intersect with each other. In this intersection area, when a magnetic field B in a direction perpendicular to the propagation direction of the pump beam 106 and the propagation direction of the probe beam 107 (the y-direction in FIG. 1) is applied, the polarization plane of the probe beam 107 is rotated by a magneto-optical effect which is called paramagnetic Faraday rotation (effect).

The rotation angle of this polarization plane (hereinafter referred to also as the "Faraday rotation angle") depends on the magnitude of the magnetic field B. Therefore, the magnitude of the Faraday rotation angle is detected by the detector 105, so that information on the strength of the magnetic field B can be obtained.

Specifically, the atoms in the cell 101 are spin-polarized in the propagation direction of the pump beam 106 (or in an anti-parallel direction of the propagation direction) by the circularly polarized pump beam 106.

Spin of the spin-polarized atoms causes precession by being subjected to torque depending on the magnetic field. This precession is represented by the Bloch equations described below. The atomic spin component is inclined from the propagation direction of the pump beam 106 by the precession.

For example, in the case where the magnetic field B is perpendicular to the plane of incidence of the pump beam 106 (the y-direction in FIG. 1), the atomic spin component in the propagation direction of the probe beam 107 (the x-direction in FIG. 1) is increased. The amount of the increase is determined by the magnitude of the magnetic field B.

In the case where the probe beam 107 passes through a medium spin-polarized in a parallel direction to the propagation direction thereof, the polarization plane of the probe beam is rotated by the magneto-optical effect. The rotation angle of the polarization plane (the Faraday rotation angle) is determined by the magnitude of the spin polarization. Accordingly, the Faraday rotation angle provides a magnitude which reflects the strength of the magnetic field B.

Next, respective constituent elements of the atomic magnetometer will be described more specifically.

The cell 101 is formed of a material, through which the pump beam 106 and the probe beam 107 passes, such as glass plastic. As the atomic group contained in the cell 101, it is possible to use a gas of an alkali metal such as potassium (K) or rubidium (Rb).

The atomic group is not necessarily placed in a gaseous state when magnetic field measurement is not carried out so long as the atomic group is placed in the gaseous state during the magnetic field measurement. For example, potassium (metal) atoms are contained in the cell 101 of glass, and when the measurement is performed, the inside of the cell 101 may be heated to about 180° C. As a result, the inside of the cell 101 can be filled with the potassium gas.

The atomic group contained in the cell 101 is not limited to alkali metal atoms. The atomic group may be constituted by any atoms so long as the atoms are capable of constituting the atomic magnetometer of the present invention. As the atomic group, in addition to K or Rb, it is possible to add atoms (e.g., xenon (Xe) atoms) capable of causing spin exchange with these atoms.

Further, in addition to the above-described atomic group, a buffer gas such as nitrogen gas ($N_2$) or helium gas (He) may also be filled in the cell 101. The buffer gas suppresses diffusion of the spin-polarized alkali metal atoms. For this reason, a spin relaxation rate caused by collision between the alkali metal atoms and an inner wall of the cell 101 is decreased, so that spin polarization is improved.

The pump beam may preferably be the circularly polarized light. The circularly polarized light propagating in the z-direction is placed in an oscillating electric field on the x-y plane. The x-component (Ex) and the y-component (Ey) of the electric field vector are represented by the following formula (1):

$$\begin{cases} E_x = A\cos(\omega t - kz + \phi) \\ E_y = \mp A\sin(\omega t - kz + \phi) \end{cases} \quad \text{<Formula (1)>}$$

wherein ω represents frequency, k represents wave number, φ represents the phase, A represents the amplitude, and t represents time. The electric field vectors represented by the above formula (1) are rotated with time in the x-y plane.

In the case where the sign of the y component (Ey) of the electric field vector is positive, the resultant polarized light is referred to as right-hand circularly polarized light. In the case where the sign is negative, the resultant polarized light is referred to as left-hand circularly polarized light.

Figure 2:
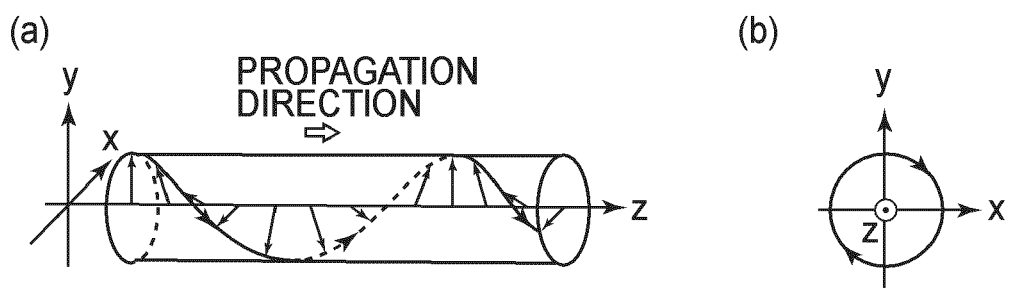
FIG. 2(a) is a schematic view showing a spatial distribution of electric field vector of right-hand circularly polarized light propagating in the z-direction.
FIG. 2(b) is a schematic view showing time dependence of the electric field vector in the x-y plane.

FIG. 2(*a*) shows a spatial distribution of the electric field vector of the right-hand circularly polarized light at a certain time. FIG. 2(*b*) shows a state in which the electric field vector of the right-hand circularly polarized light is rotated with time in the x-y plane.

The electric field vector of the right-hand circularly polarized light is rotated clockwise with time in the x-y plane as seen in a direction opposite to the propagation direction thereof.

Figure 3:
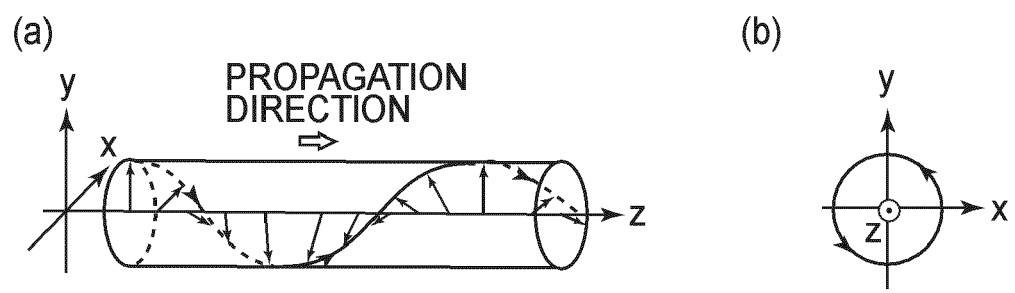
FIG. 3(a) is a schematic view showing a spatial distribution of electric field vector of left-hand circularly polarized light propagating in the z-direction.
FIG. 3(b) is a schematic view showing time dependence of the electric field vector in the x-y plane.

FIG. 3(*a*) shows a spatial distribution of the electric field vector of the left-hand circularly polarized light at a certain time. FIG. 3(*b*) shows a state in which the electric field vector of the left-hand circularly polarized light is rotated with time in the x-y plane.

The electric field vector of the left-hand circularly polarized light is rotated counterclockwise with time in the x-y plane as seen in a direction opposite to the propagation direction thereof.

Next, the case where the right-hand circularly polarized light is reflected by the mirror will be described. As described above, the electric field vector of the right-hand circularly polarized light propagating in the z-direction is represented by the following formula (2):

$$\begin{cases} E_x = A\cos(\omega t - kz + \phi) \\ E_y = A\sin(\omega t - kz + \phi) \end{cases} \quad \text{<Formula (2)>}$$

When this right-hand circularly polarized light is reflected by the mirror, the propagation direction of the reflected light is opposite to the propagation direction the incident light. That is, the electric field vector of the reflected light is represented by the following formula (3):

$$\begin{cases} E_x = A\cos(\omega t + kz + \phi') \\ E_y = A\sin(\omega t + kz + \phi') \end{cases} \quad \text{<Formula (3)>}$$

The phase φ' of the reflected light is generally different from that of the incident light but the change in phase presents no problem in the present invention.

Figure 4:
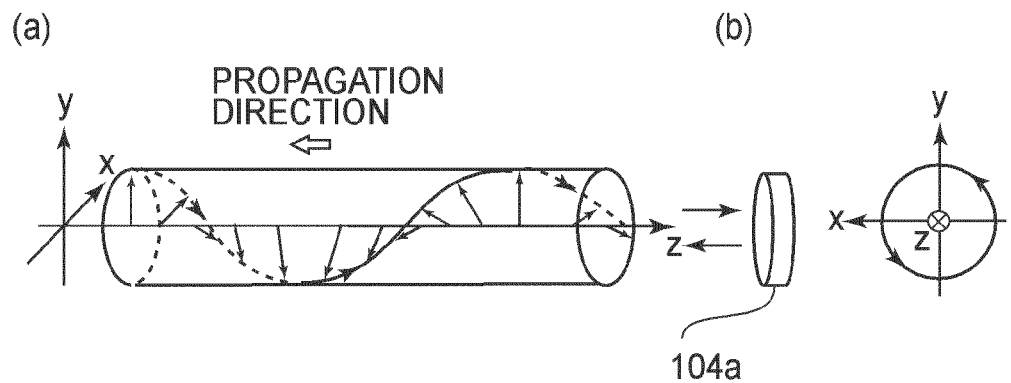
FIG. 4(a) is a schematic view showing a spatial distribution of electric field vector of reflected light when right-hand circularly polarized light propagating in the z-direction.
FIG. 4(b) is a schematic view showing time dependence of the electric field vector in the x-y plane.

FIG. 4(*a*) shows a spatial distribution of the electric field vector represented by formula (3) at a certain time. FIG. 4(*b*) shows a state in which the electric field vector represented by formula (3) is rotated with time in the x-y plane.

The electric field vector represented by formula (3) is rotated counterclockwise with time in the x-y plane as seen in a direction opposite to the propagation direction thereof. That is, when right-hand circularly polarized light is reflected by the mirror, the reflected light is left-hand circularly polarized light. Similarly, when left-hand circularly polarized light is reflected by the mirror, the reflected light is right-hand circularly polarized light.

These changes are caused by the phenomenon that the rotational direction of the electric field vector is not changed as between before and after the reflection, but the light propagation direction is reversed as between before and after the reflection.

The spin polarization of the atomic group by the pump beam 106 is performed by using a phenomenon which is called "circularly polarized light pumping" or simply "pumping". The right-hand circularly polarized light uniformizes the spin of the atomic group directed in a random direction to that in the light propagation direction. Further, the left-hand circularly polarized light uniformizes the spin of the atomic group to that in a direction opposite to the light propagation direction.

Therefore, the circularly polarized light incident on the first mirror 104*a* in a direction perpendicular to the first mirror 104*a* and its reflected light uniformize the spin of the atomic group in the same direction. As a result, the atomic magnetometer of this embodiment can improve the degree of the spin polarization. The spin polarization of the atomic group can be realized based on conservation of angular momentum. The circularly polarized light has angular momentum, so that the spin quantum number of the atoms is changed when the atoms are excited by absorbing the circularly polarized light. The right-hand circularly polarized light has the spin quantum number of 1 and the left-hand circularly polarized light has the spin quantum number of −1. Accordingly, when the atoms absorb the right-hand circularly polarized light, the atoms are excited in a state which is increased in spin quantum number by 1. On the other hand, in the case of the left-hand circularly polarized light, the atoms are excited in a state which is decreased in spin quantum number by 1.

The atoms, once excited, emit light in a random polarization state by spontaneous emission or lose energy by collision with the buffer gas, thus being relaxed to their ground state.

As described above, by the circularly polarized pump beam 106, it is possible to spin-polarize the atomic group.

The wavelength of the probe beam 106 coincides with a resonance line of the atoms so that the atoms in the cell 101 can be spin-polarized. For example, when the atoms are of an alkali metal, the wavelength of the pump beam 106 may only be required to coincide with the D1 resonance line of the alkali metal. When the alkali metal is potassium, that wavelength corresponds to about 770 nm.

The wavelength of the probe beam 107 is not limited to that coinciding with the D1 resonance line of the atoms but may also coincide with other resonance lines.

On the other hand, the wavelength of the probe beam 107 may desirably be detuned from the resonance line of the atoms so that the atoms in the cell 101 are unnecessarily excited. The probe beam 107 may desirably be linearly polarized light but may also include other polarization components in the present invention so long as the probe beam 107 does include the linearly polarized light component.

As described above, when the linearly polarized light is caused to enter the spin-polarized atomic group, the polarization plane of the linearly polarized light is rotated. This is attributable to a difference in refractive index in the spin-polarized atomic group between the right-hand circularly polarized light and the left-hand circularly polarized light. Specifically, the spin component with respect to the direction parallel to the light propagation direction causes a difference in refractive index between the right-hand circularly polarized light and the left-hand circularly polarized light.

The linearly polarized light is in a state in which the right-hand circularly polarized light and the left-hand circularly polarized light are superposed on each other. For that reason, when the linearly polarized light enters the spin-polarized atomic group, a difference in phase (phase difference) between the right-hand circularly polarized light and the left-hand circularly polarized light is changed. This change in phase difference corresponds to a change in angle of the polarization plane.

Therefore, the linearly polarized probe beam 107 passes through the spin-polarized atomic group, so that the polarization plane is rotated. The rotation angle of the polarization plane (Faraday rotation angle) is proportional to the magnitude of a spin component which is parallel to the propagation direction of the probe beam 107.

The spin component depends on the magnitude of the magnetic field perpendicular to the plane of incidence of the pump beam 106. For this reason, by detecting the Faraday rotation angle by means of the detector 105, it is possible to measure the magnetic field indirectly. The detector 105 may be any device so long as the device is capable of measuring the Faraday rotation angle.

The pump light source 102 and the probe light source 103 may be separate light sources or a common light source. In the case of using a common light source, light emitted from the common light source is separated into two beams which are detuned by utilizing, e.g., an acoustooptic device. These two beams may be used as the circularly polarized pump beam 106 and the linearly polarized probe beam 107. As the light source(s) for emitting the pump beam 106 and the probe beam 107, a laser light source can be used. For example, in the case of using potassium as the atomic group to be contained in the cell 101, a laser light source with a wavelength of 770.1 nm can be used for emitting the pump beam 106. Further, the laser light source with a wavelength of about 769.9 nm can be used for emitting the probe beam 107.

Hereinbelow, the actuation principle of the atomic magnetometer of this embodiment will be described.

First, the atomic group in the cell 101 is irradiated with the right-hand circularly polarized pump beam 106 to spin-polarize the atomic group in the propagation direction (A1 in FIG. 1) of the pump beam 106.

The pump beam 106, having passed through the cell 101, is reflected by the first mirror 104a and then passes through the cell 101 again. In this case, the reflected pump beam is left-hand circularly polarized light.

By this left-hand circularly polarized light, the atomic group in the cell 101 is spin-polarized in the opposite direction (A2 in FIG. 1) to the propagation direction of the pump beam.

In FIG. 1, the angle of incidence of the pump beam is illustrated as a large angle for facilitating viewability. Actually, the angle of incidence of the pump beam is small, so that the optical paths of the pump beam before and after the reflection substantially overlap with each other. By the pump beam 106 after the reflection, spin components directed in a direction (the z-direction in FIG. 1) perpendicular to the probe beam 107 are increased, and spin components directed in a direction (the x-direction in FIG. 1) parallel to the probe beam 107 cancel each other.

That is, when there is no magnetic field in the cell 101, the atomic group is spin-polarized in the direction perpendicular to the probe beam 107.

Next, the behavior of atomic spin of the atomic group in the case where the magnetic field is applied in the direction perpendicular to the plane of incidence of the pump beam will be described in detail. In the following description, a coordinate system coincides with that shown in FIG. 1. That is, the propagation direction of the probe beam 107 is the x-direction and the magnetic field is applied in the y-direction. Further, the propagation direction of the pump beam 106 forms the angle θ with respect to the propagation direction (the x-direction) of the probe beam 107.

First, the spin vector S of the polarized atom is represented by the following formula (4):

$$s=(s_x,s_y,s_z) \qquad \text{<Formula (4)>}$$

The behavior of the spin vector is determined by interaction with the magnetic field B and interaction with the pump beam 106. The behavior of the spin satisfies the Bloch equation represented by the following formula (5):

$$\frac{d}{dt}s = \frac{\gamma_e}{Q}B \times s - \Gamma_{\mathit{eff}}s + P_t \qquad \text{< Formula (5) >}$$

where $\gamma_e$ represents the geomagnetic ratio, Q represents a slowdown factor depending on spin polarization rate (degree), $\Gamma_{\mathit{eff}}$ represents a spin relaxation rate, B represents the magnetic field vector, and $P_t$ represents a pumping vector. The pumping vector $P_t$ represents the interaction between the atomic spin and the pump beam 106, i.e., the spin polarization by the pump beam 106. The pumping vector $P_t$ is proportional to a vector along the propagation direction of the pump beam 106.

A pumping vector P produced by the pump beam 106 before the reflection by the first mirror 104a is represented by the following formula (6):

$$P=\sigma(R \cos \theta,0,R \sin \theta) \qquad \text{<Formula (6)>}$$

where σ represents the degree of circular polarization of the pump beam 106 and R represents the pumping rate.

The degree of circular polarization is +1 for the right-hand circularly polarized light and is −1 for the left-hand circularly polarized light. In the case where the circularly polarized light is not complete circularly polarized light, the absolute value of the circular polarization degree σ is less than 1.

Next, the pumping vector in the pump beam 106 reflected by the first mirror 104a will be described. A pumping vector $P_r$ in the pump beam 106 after the reflection is represented by the following formula (7):

$$P_r=-\sigma(R \cos \theta,0,-R \sin \theta) \qquad \text{<Formula (7)>}$$

In formula (7), however, intensity attenuation of the reflected light and disturbance of the circularly polarized light is small, and thus is neglected.

From the above formulas (6) and (7), a total pumping vector $P_t$ in the pump beam 106 before and after the reflection is represented by the following formula (8):

$$P_t = P + P_r = 2\sigma(0, 0, R\sin\theta) \quad \text{<Formula (8)>}$$

The x-component of the total pumping vector $P_t$ is zero and the z-component thereof is increased.

Next, a stationary solution to Bloch equation (formula (5)) will be described. First, the magnetic field vector B directed in the y-direction is represented by the following formula (9):

$$B = (0, B_{off} + B_{sig}, 0) \quad \text{<Formula (9)>}$$

where $B_{sig}$ represents a magnetic field created by the object to be measured (hereinafter referred to as the "measurement magnetic field") and $B_{off}$ represents a magnetic field created by a portion other than the object to be measured (hereinafter referred to as the "residual magnetic field").

In the following description, the equations $\gamma_e \times B_{off}/Q = \Omega_{off}$ and $\gamma_e B_{sig}/Q = \Omega_{sig}$ are satisfied.

First, as a comparative embodiment, a conventional atomic magnetometer in which the pump beam 106 is not reflected will be described. In the conventional atomic magnetometer as the comparative embodiment, the pumping vector is represented by the above-described formula (6).

In this case, the stationary solution to Bloch equation (formula (5)) is given by the following formula (10):

$$s_x = \frac{\sigma R}{\Gamma_{eff}^2 + \Omega^2}(\Gamma_{eff}\cos\theta - \Omega_{off}\sin\theta - \Omega_{sig}\sin\theta) \quad \text{<Formula (10)>}$$

wherein $\Omega$ is defined as $\Omega_{sig} + \Omega_{off}$. Further, the y-component and z-component of the atomic spin do not play a role in actuating the atomic magnetometer, and thus are omitted from explanation.

The x-component of the atomic spin includes the $\Omega_{sig}$-component, $\Gamma_{eff}$-component and $\Omega_{off}$-component in mixture. The $\Gamma_{eff}$-component results from the x-component of the pumping vector. That is, the $\Gamma_{eff}$-component results from the fact that the optical path of the pump beam 106 and the optical path of the probe beam are not perpendicular to each other (hereinafter referred to as "non-orthogonality").

Therefore, an output signal also includes a signal resulting from the non-orthogonality, a signal resulting from the measurement magnetic field, and a signal resulting from the residual magnetic field in mixture. Even in the case of no measurement magnetic field, there are the signal resulting from the non-orthogonality and the signal resulting from the residual magnetic field in mixture.

For that reason, even when the output signal is observed, the residual magnetic field cannot be canceled by, e.g., Helmholtz coils.

In the case where the optical paths of the pump beam 106 and the probe beam 107 accurately cross with each other at right angles, there is no mixed output signal described above, so that the residual magnetic field can be canceled. However, in general, it is very difficult to cross the optical paths of the pump beam 106 and the probe beam 107 each other at right angles.

Next, the case where the pump beam 106 is reflected by the first mirror 104a, i.e., the case of the atomic magnetometer of this embodiment according to the present invention, will be described. In this case, a total pumping vector is given by the above-described formula (8).

Therefore, the stationary solution to Bloch equation (formula (5)) is given by the following formula (11):

$$s_x = \frac{2\sigma R}{\Gamma_{eff}^2 + \Omega^2}(-\Omega_{off}\sin\theta - \Omega_{sig}\sin\theta) \quad \text{<Formula (11)>}$$

In this embodiment (First Embodiment), even in the case where the optical paths of the pump beam 106 do not accurately cross with each other at right angles, the $\Gamma_{eff}$-component is canceled. This shows that the influence of the non-orthogonality between the pump beam 106 and the probe beam 107 is eliminated.

Therefore, the output signal in a state of no measurement magnetic field only consists of the signal resulting from the residual magnetic field. For this reason, the residual magnetic field can be easily canceled by the Helmholtz coils or the like.

Further, with an increase in the z-component of the pumping vector, the spin polarization becomes large. That is, the spin polarization degree of the atomic group is increased. Therefore, the Faraday rotation angle is increased, so that detection sensitivity is improved.

Next, the theoretical limitation to measurement accuracy of the measurement magnetic field in such an atomic magnetometer will be described. The theoretical limitation to the measurement accuracy is determined by the degree of accurate spin polarization of the atomic group and is represented by the following formula (12):

$$s_x = \frac{2\sigma R}{\Gamma_{eff}^2 + \Omega^2}(-\Omega_{off}\sin\theta - \Omega_{sig}\sin\theta) \quad \text{<Formula (12)>}$$

wherein N represents the number of spin-polarized atoms, $T_2$ represents the transverse relaxation time, and t represents the measuring time.

Thus, the theoretical limitation of the measurement accuracy is decreased with longer transverse relaxation time $T_2$. In other words, with longer transverse relaxation time $T_2$, the measurement accuracy can be improved. The transverse relaxation time $T_2$ is longer with a measuring area closer to zero magnetic field and with a higher degree of the spin polarization of the atomic group.

As described above, in this embodiment, the residual magnetic field in the measuring area can be easily canceled and the spin polarization degree can also be increased, so that the transverse relaxation time $T_2$ becomes longer. Therefore, the measurement accuracy can be improved.

In the above description, the measurement magnetic field is a static magnetic field. However, even in the case of an oscillating magnetic field with a low frequency, to the extent that the oscillating magnetic field can be regarded as the static magnetic field, a similar effect can be achieved.

In the magnetic force measuring method according to the present invention, the atomic group contained in a hollow portion of the cell is irradiated with the pump beam, so that atoms constituting the atomic group are uniformized in spin direction. Then, the atomic group uniformized in spin direction is irradiated with the linearly polarized light as the probe beam to detect the rotation angle of the polarization plane of the probe beam. The magnetic force measuring method has the following features.

Specifically, the pump beam which has passed through the cell is reflected so as to pass through the cell at least two times. The probe beam is passed through the cell while crossing the pump beam at least two times in the cell. The probe beam, after passing through the cell in the above-described manner, is subjected to measurement of the rotation angle of the polarization plane thereof.

In order to carry out such a magnetic force measuring method, as described later, the probe light source for emitting the above-described probe beam, the pump light source for emitting the above-described pump beam, the mirror for folding the probe beam back, and the detector are required. The detector detects the rotation angle of the polarization plane.

Incidentally, the mirror to be applied to the present invention is not particularly limited. For example, as the mirror, it is possible to apply a metal mirror, a semiconductor multi-layer mirror, and a dielectric multilayer mirror.

Hereinafter, the atomic magnetometer according to the present invention will be described more specifically based on several embodiments.

Embodiment 1

Figure 5:
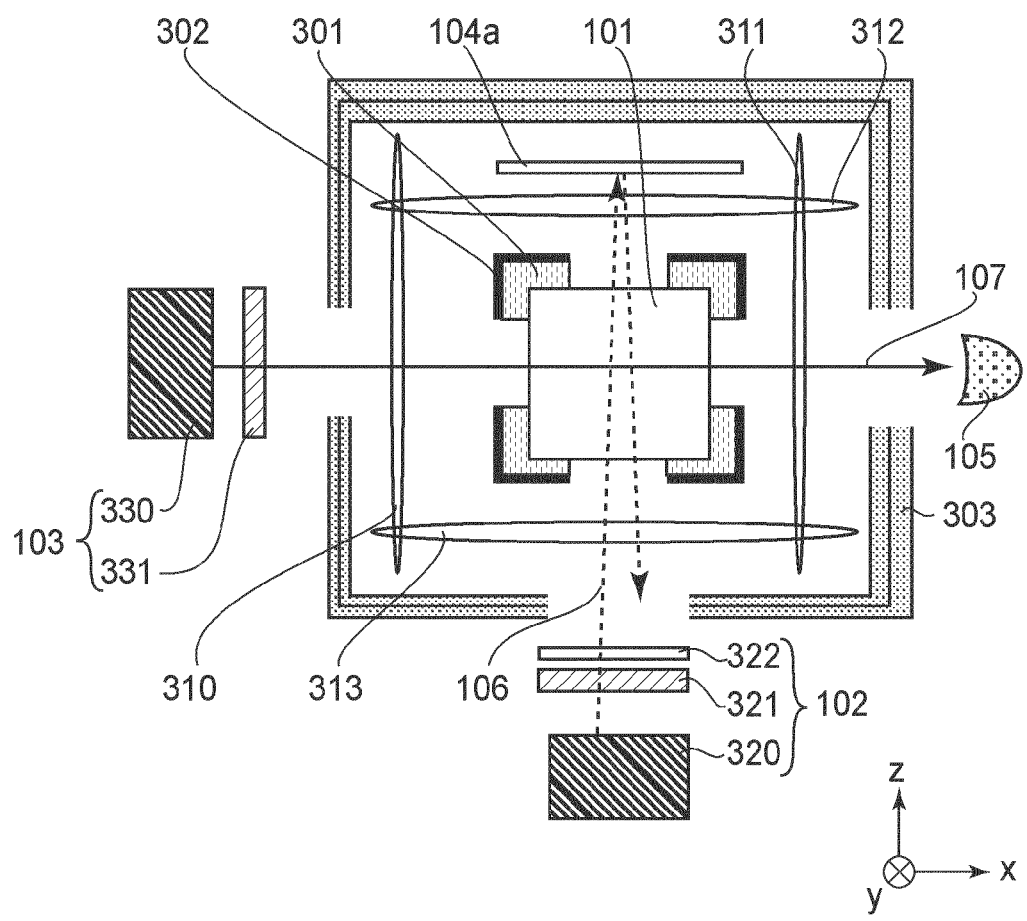
FIG. 5 is a schematic view showing an atomic magnetometer according to Embodiment 1 of the present invention.

FIG. 5 is a schematic sectional view for illustrating an optical pumping magnetometer (atomic magnetometer) according to this embodiment.

The atomic magnetometer of this embodiment includes the cell 101 containing the atomic group, the pump light source 102, the probe light source 103, the first mirror 104a, and the detector 105.

The cell 101 is disposed between the pump light source 102 and the first mirror 104a and between the probe light source 103 and the detector 105. The optical path of the probe beam 107 crosses the optical path of the pump beam 106 in the cell 101.

The pump beam 106 emitted from the pump light source 102 is circularly polarized light. The pump beam 106 passes through the cell 101 and is reflected by the first mirror 104a and thereafter passes through the cell 101 again.

The probe beam 107 emitted from the probe light source 103 is linearly polarized light. The probe beam 107 propagates in a direction (the x-direction in FIG. 5) which is parallel to the plane of incidence of the pump beam 106 and is also parallel to the surface of the first mirror 104a, and crosses the pump beam in the cell 101. The probe beam 107, having passed through the cell 101, enters the detector 105.

The cell 101 containing the atomic group is a glass cell which is made airtight. The cell 101 contains helium (He) and nitrogen gas ($N_2$) as a buffer gas, in addition to potassium (K) constituting the atoms of the atomic group.

At a periphery of the cell 101, an oven 301 is provided and a heat insulating layer 302 is provided so as to cover the outer surface of the oven 301. The oven 301 is provided with openings corresponding to the optical paths of the pump beam 107 and the probe beam. Similarly, the heat insulating layer is also provided with openings corresponding to the optical paths of the pump beam 107 and the probe beam.

Heated nitrogen gas or heated air externally flows into the oven 301 so as to heat the alkali metal in the cell 101.

The heat insulating layer 302 is used in order to keep the area outside the heat insulating layer 302 at about room temperature. As desired, the heat insulating layer 302 may also be provided with a waste-heat mechanism. This mechanism can be realized by providing a tube for circulating cooling water in the heat insulating layer 302.

Further, the cell 101 is provided with Helmholtz coils at upper, lower, left, right, front and rear portions. The cell 101, the oven 301, the heat insulating layer 302, and the Helmholtz coils are placed in a magnetic shielding box 303.

The magnetic shielding box 303 is provided with openings at portions corresponding to the optical paths of the pump beam 107 and the probe beam 106. The pump beam 107 and the probe beam 106 enter the cell 101 through the respective openings.

The magnetic shielding box 303 is provided in order to block the magnetic noise such as the terrestrial magnetism. The magnetic shielding box 303 may, e.g., be formed of Mumetal (16Fe-77Ni-2Cr-5Cu) in three layers.

The Helmholtz coils are not shielded by the magnetic shielding box 303 and are used in order to cancel the magnetic noise remaining in the cell 101 (the residual magnetic field).

The Helmholtz coils 310 and 311 provided at both sides of the cell 101 with respect to the x-direction (FIG. 5) are used for canceling the residual magnetic field in the x-direction.

Similarly, the Helmholtz coils 312 and 313 provided at both sides of the cell 101 with respect to the z-direction (FIG. 5) are used for canceling the residual magnetic field in the z-direction.

Further, other Helmholtz coils (not shown) are provided at both sides of the cell 101 with respect to the y-direction (FIG. 5) in order to cancel the residual magnetic field in the y-direction.

The pump light source 102 includes a laser light source 320, Glan-Thompson prism 321, and a quarter-wave plate 322. The laser light emitted from the laser light source 320 passes through the Glan-Thompson prism 321 and the quarter-wave plate 322 in this order.

The laser light is converted into linearly polarized light by the Glan-Thompson prism 321 and then is converted into circularly polarized light by the quarter-wave plate 322. In this case, linearly polarized light may be converted into either right-hand circularly polarized light or left-hand circularly polarized light.

The pump beam 106 passes through the openings for the magnetic shielding box 303, the heat insulating layer 302, and the oven 301, so that the alkali metal gas in the cell 101 is irradiated with the pump beam 106. The pump beam 106 which has passed through the cell 101 is reflected by the first mirror 104a and then passes through the cell 101 again.

At the first mirror 104a, the multilayer dielectric mirror may desirably be used. The multilayer dielectric mirror is capable of reducing the magnetic noise which is said to occur due to Johnson noise or the like. For that reason, it is possible to lower the intensity of the reflected pump beam 106 and to reduce the degree of disturbance of the circularly polarized light.

The probe light source 103 includes a laser light source 330 and Glan-Thompson prism 331. The laser light emitted from the laser light source 330 passes through the Glan-Thompson prism 331.

The laser light is converted into the linearly polarized light by the Glan-Thompson prism 331. The thus linearly polarized probe beam 107 can enter the cell 101.

The probe beam 107 passes through the openings for the magnetic shielding box 303, the heat insulating layer 302, and the oven 301, so that the alkali metal gas in the cell 101 is irradiated with the probe beam 107. The probe beam 107 which has passed through the cell 101 enters the detector 105.

The detector 105 measures the Faraday rotation angle with respect to the probe beam 107. As such a detector 105, it is possible to use a balance-type polarimeter, a crossed Nicol-type polarimeter, or the like.

Figure 6:
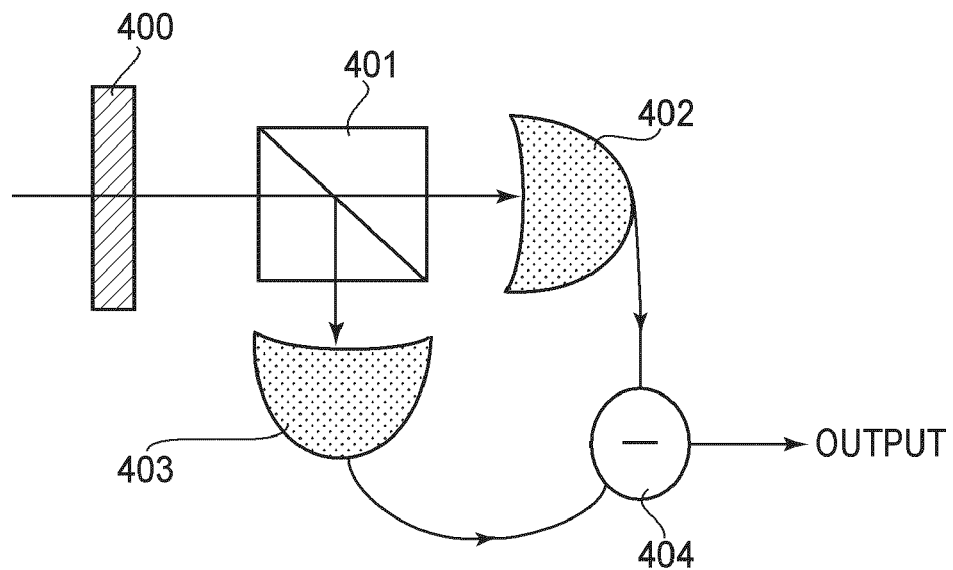
FIG. 6 is a schematic view showing a detector used in the atomic magnetometer.

FIG. 6 is a schematic view showing the balance-type polarimeter. The balance-type polarimeter includes a half-wave plate 400, a polarization beam splitter 401, two photo-diodes 402 and 403, and a differential amplifying circuit 404.

The half-wave plate 400 rotates the polarization plane of the probe beam 107. The polarization beam splitter 401 divides the probe beam 107 into a linearly polarized light component directed in a first direction and a linearly polarized light component directed in a direction perpendicular to the first direction.

The polarization beam splitter 401 is provided so that the probe beam 107 is divided into two light components having the same intensity in the case where the Faraday rotation angle of the probe beam 107 is zero. For this purpose, the polarization plane of the probe beam 107 is rotated by a certain angle by the half-wave plate 400. The two light components divided by the polarization beam splitter 401 enter the respective photo-diodes 402 and 403. The photo-diodes 402 and 403 generate currents depending on intensities of the respective received light components.

The two photo-diodes 402 and 403 are connected to a single differential amplifying circuit 404. The differential amplifying circuit 404 amplifies a difference value between the currents generated by the two photo-diodes 402 and 403.

The differential amplifying circuit 404 amplifies the difference value between the currents by an amplifier and is capable of converting the value into a voltage value to be outputted.

In the case where the Faraday rotation angle for the probe beam 107 is zero, the light components having the same intensity enter the two photo-diodes 402 and 403. Therefore, the output signal of the differential amplifying circuit 404 is zero.

On the other hand, in the case where the Faraday rotation angle is not zero, the intensity of light divided by the polarization beam splitter 401 is changed. That is, the Faraday rotation angle can be measured based on the output signal of the differential amplifying circuit 404.

The Faraday rotation angle depends on the magnitude of the measurement magnetic field in a direction perpendicular to the plane formed by the pump beam 106 and the probe beam 107. Thus, the atomic magnetometer according to this embodiment can be measure the magnitude of the measurement magnetic field.

In the atomic magnetometer of this embodiment, by virtue of reflection of the pump beam 106 by the first mirror 104a, the atomic group can be subjected to pumping two times. As a result, the spin polarization rate can be enhanced.

Further, as described in connection with the general First Embodiment above, the residual magnetic field in the cell 101 can be easily canceled, so that a high-sensitivity atomic magnetometer can be provided.

Further, the optical path of the pump beam 106 is folded back, so that the area of the spin-polarized atomic group is extended and the number of spin-polarized atoms is also increased. Accordingly, the effect that the output signal for the measurement magnetic field is increased is also achieved.

Even in the case where the optical paths of the pump beam 106 and the probe beam 107 accurately cross with each other at right angles, the spin polarization degree is improved by the two times of pumping, so that non-uniformity of distribution of the polarization degree in the cell can be decreased.

In the conventional atomic magnetometer, a light-absorbing material is provided at an end of the optical path of the pump beam. In this case, scattered light of the pump beam enters the cell and the detector, and detection accuracy is lowered as a result. In this embodiment, the end of the optical path of the pump beam is constituted by the first mirror 104a for folding the pump beam back, so that it is possible to suppress the reduction in detection accuracy.

In the case where optical paths of incident light and reflected light overlap with each other by reflecting coherent light, a standing wave with the first mirror 104a as a fixed end can occur. This standing wave has a strength distribution with a period corresponding to approximately a wavelength thereof, so that there is a possibility that the spin polarization of the atomic group may cause distribution. However, the measurement area is of the order of several centimeters and in this area, the atomic group is sufficiently diffused. For this reason, it can be considered that the influence of this standing wave is negligible.

Next, an example of a result of an experiment carried out based on this embodiment will be described. In this experiment, as the measurement magnetic field, an oscillating magnetic field having a frequency of 40 Hz and an amplitude of 80 pT was applied in the y-direction.

Further, as a comparative embodiment, a similar experiment was conducted by using an atomic magnetometer having such a constitution that the pump beam passed through the cell 101 only one time.

Figure 7:
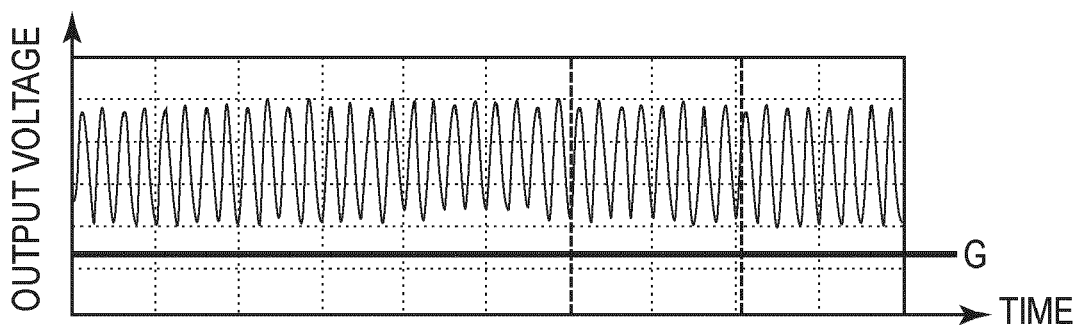
FIG. 7(a) is a graph showing time dependence of an output voltage in an atomic magnetometer according to a comparative embodiment.
FIG. 7(b) is a graph showing time dependence of an output voltage in the atomic magnetometer according to Embodiment 1.
Figure 7:
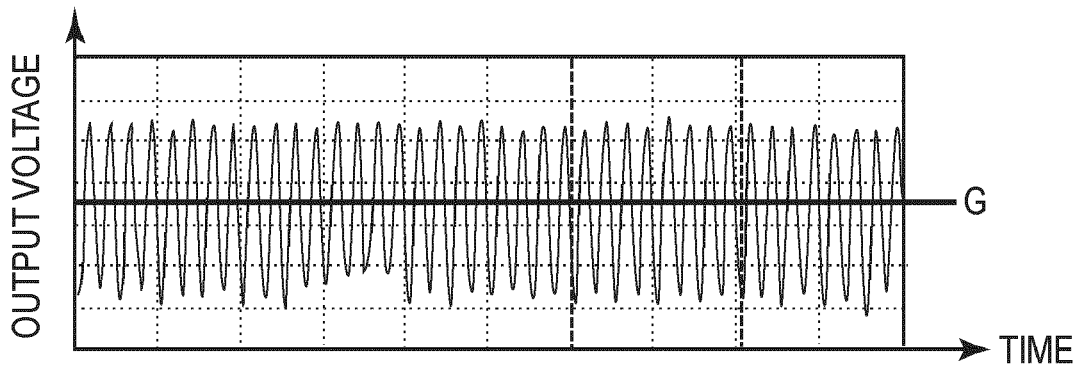

FIG. 7(a) is a graph showing a time-dependency of an output voltage in the atomic magnetometer of the comparative embodiment, and FIG. 7(b) is a graph showing a time-dependency of an output voltage in the atomic magnetometer of Embodiment 1.

In these figures, the G lines represent the output voltage in the case of no irradiation with the pump beam 106. The output voltage is adjusted so as to provide a ground (GND) level.

In the experiment result in the comparative embodiment, the average level of the output signal is largely deviated from the GND level. This is because the result reflects the influence of non-orthogonality between the pump beam 106 and the probe beam 107.

In the experiment result in Embodiment 1, the average level of the output signal substantially coincides with the GND level. This is because the influence of the non-orthogonality between the pump beam 106 and the probe beam 107 is canceled.

Figure 8:
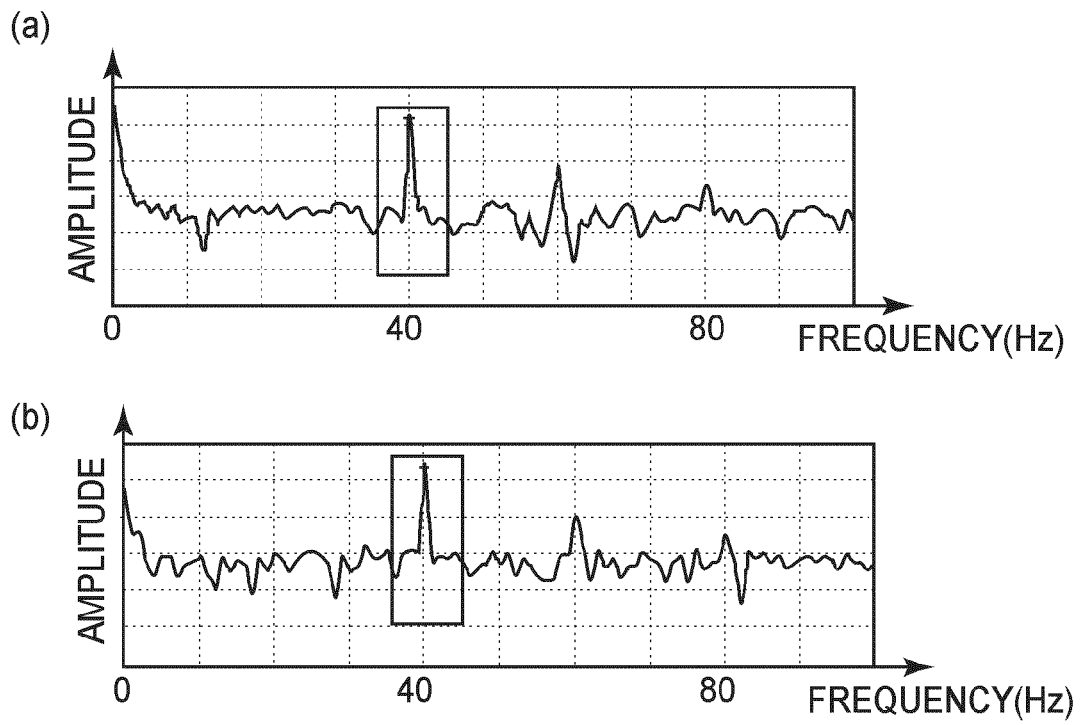
FIG. 8(a) is a graph showing an amplitude spectrum of the output voltage in the atomic magnetometer according to a comparative embodiment.
FIG. 8(b) is a graph showing an amplitude spectrum of the output voltage in the atomic magnetometer according to Embodiment 1.

FIG. 8(a) is a graph showing an amplitude spectrum of the output voltage in the atomic magnetometer of the comparative embodiment, and FIG. 8(b) is a graph showing an amplitude spectrum of the output voltage in the atomic magnetometer of Embodiment 1.

The amplitude spectrum can be obtained by subjecting the time-dependence of the output voltage to a fast Fourier transform (FFT). In the figures, the abscissa represents frequency (Hz) and the ordinate represents the amplitude of the output voltage for an associated frequency and is represented on a logarithmic scale basis.

The amplitude of the output voltage at a frequency of 40 Hz can be considered as a response to the oscillating magnetic field. Referring to FIGS. 8(a) and 8(b), at the frequency of 40 Hz, the amplitude of the output voltage in Embodiment 1 is larger than that in the comparative embodiment. Specifically, in the comparative embodiment, the amplitude of 40 Hz is 5.27 V (2.40 dBV). On the other hand, in FIG. 1, the amplitude at 40 Hz is 7.95 V (5.97 dBV), which is about 1.5 times that in the comparative embodiment.

As described above, in the atomic magnetometer in Embodiment 1, the output signal is increased with an increase in spin polarization degree or an increase in number of spin-polarized atoms. Therefore, the atomic magnetometer in Embodiment 1 has high sensitivity.

Embodiment 2

Figure 9:
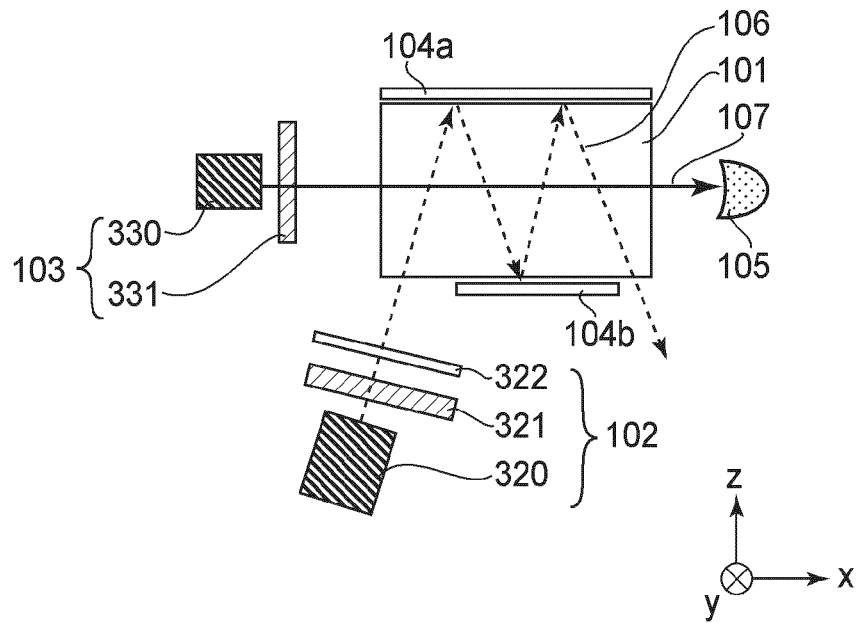
FIGS. 9, 10, 11 and 12 are schematic views showing atomic magnetometers according to Embodiment 2, Embodiment 3, Embodiment 4, and another general embodiment, respectively, of the present invention.

FIG. 9 is a schematic sectional view for illustrating an optical atomic magnetometer according to this embodiment.

The atomic magnetometer of this embodiment includes the cell 101 containing the atomic group, the pump light source 102, the probe light source 103, and the detector 105. The atomic magnetometer further includes the first mirror 104a and a second mirror 104b.

The cell 101 is disposed between the pump light source 102 and the first mirror 104a and between the probe light source 103 and the detector 105.

The second mirror 104b is disposed between the cell 101 and the pump light source 102. Specifically, the second mirror 104b is disposed somewhat rightward in FIG. 9 so as not to overlap the optical axis of the pump light source 102.

The first mirror 104a and the second mirror 104b are provided parallel to each other. The cell 101 is provided between the first mirror 104a and the second mirror 104b. As the first mirror 104a and the second mirror 104b, the multilayer dielectric mirror may desirably be used in order to reduce the magnetic noise.

The pump light source 102 includes a laser light source 320, Glan-Thompson prism 321, and a quarter-wave plate 322. The laser light emitted from the laser light source 320 passes through the Glan-Thompson prism 321 and the quarter-wave plate 322 in this order to be converted into circularly polarized light.

The probe light source 103 includes a laser light source 330 and Glan-Thompson prism 331. The laser light emitted from the laser light source 330 passes through the Glan-Thompson prism 331 to be converted into linearly polarized light.

The pump beam 106 is reflected by the first mirror 104a and passes through the cell 101 again. Thereafter, the pump beam 106 is reflected again by the second mirror 104b to pass through the cell 101, so that the pump beam 106 is reflected again by the first mirror 104a to pass through the cell 101.

As described above, in Embodiment 2, the pump beam 106 passes through the cell 106 four times. As a result, the spin polarization degree of the atomic group in the cell 101 is improved, so that a higher-sensitivity atomic magnetometer can be provided.

Further, similarly as in Embodiment 1, the magnetic shield box 303, the Helmholtz coils for compensating for the magnetic field, the oven 301 for heating an inner portion of the cell 101, and the heat insulating layer 302 are provided to prepare the atomic magnetometer.

As the detector 105, similarly as in Embodiment 1, it is possible to use the balance-type polarimeter, the crossed Nicol-type polarimeter, or the like.

The atomic magnetometer in this embodiment is configured so that the pump beam 106 passes through the cell 101 four times. In this embodiment, however, the atomic magnetometer may be configured so that the pump beam 106 can pass through the cell 101 three times or more, so that the spin polarization degree of the atomic group can be enhanced when compared with the case of the atomic magnetometer in Embodiment 1. Further, by passing the pump beam 106 through the cell 101 plural times, the area of the spin-polarized atoms is enlarged to increase the number of the spin-polarized atoms, so that the output signal with respect to the measurement magnetic field is improved. Therefore, sensitivity of the atomic magnetometer can be improved.

Further, it is preferable to pass the pump beam 106 through the cell 101 plural times. This is because, as described in connection with the above First Embodiment, the influence of the non-orthogonality between the pump beam 106 and the probe beam 107 is canceled.

Embodiment 3

Figure 10:
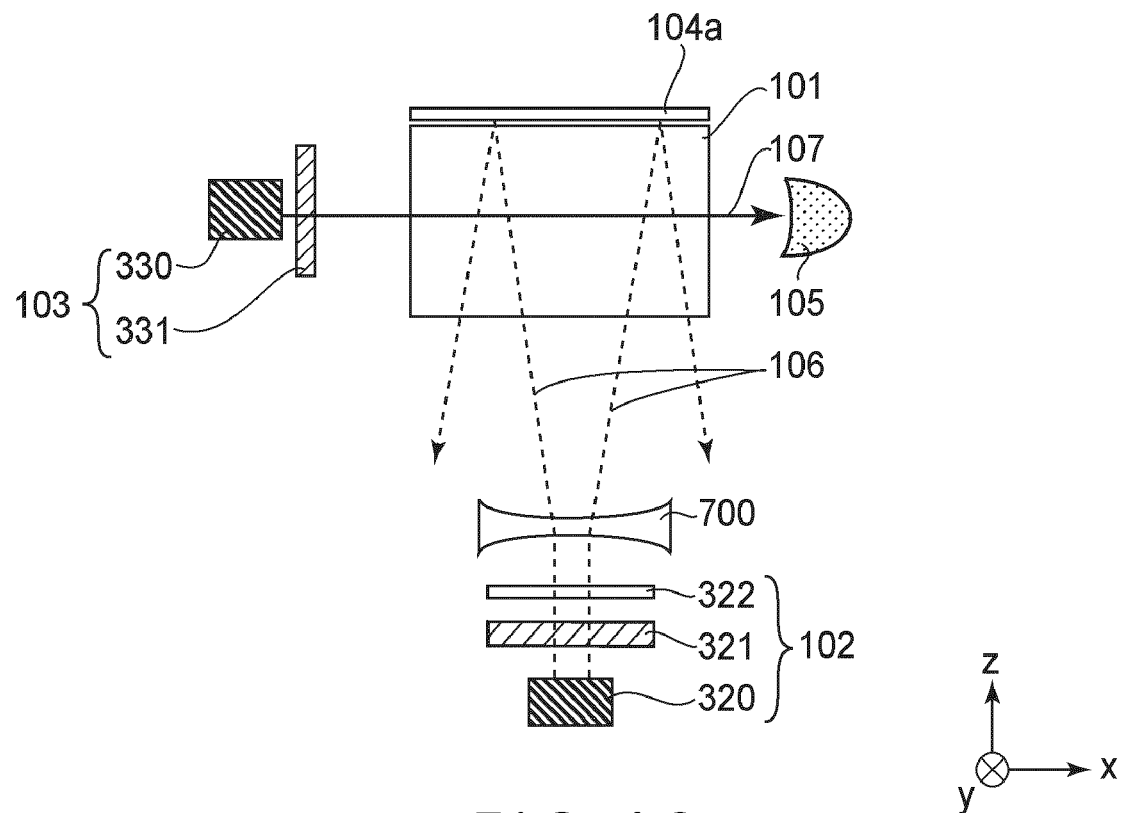

FIG. 10 is a schematic sectional view for illustrating an optical atomic magnetometer according to this embodiment.

The atomic magnetometer of this embodiment includes the cell 101 containing the atomic group, the pump light source 102, the probe light source 103, the first mirror 104a, and the detector 105.

The cell 101 is disposed between the pump light source 102 and the first mirror 104a and between the probe light source 103 and the detector 105. The optical path of the probe beam 107 crosses the optical path of the pump beam 106 in the cell 101.

The pump light source 102 includes a laser light source 320, Glan-Thompson prism 321, and a quarter-wave plate 322. The laser light emitted from the laser light source 320 passes through the Glan-Thompson prism 321 and the quarter-wave plate 322 in this order to be converted into circularly polarized light.

The probe light source 103 includes a laser light source 330 and Glan-Thompson prism 331. The laser light emitted from the laser light source 330 passes through the Glan-Thompson prism 331 to be converted into linearly polarized light.

As the detector 105, similarly as in Embodiment 1, it is possible to use a balance-type polarimeter, a crossed Nicol polarizer, or the like.

The atomic magnetometer of this embodiment further includes an optical part (element) between the pump light source 102 and the cell 101. In this embodiment, as the optical part, a concave lens 700 is used and is provided for changing the pump beam 106 into (a pencil of) divergent light.

When the pump beam 106 can be changed into divergent light, in place of the concave lens 700, various optical parts (elements) can be used.

In the conventional atomic magnetometer, in general, the pump beam 106 is adjusted to a parallel beam (light). As the optical part for adjusting the pump beam 106 to a parallel beam, two convex lenses, a combination of the convex lens and the concave lens, or the like may be used.

In this embodiment, the pump beam 106 may be divergent light, and so it may be that only the concave lens 700 is used as the optical part. For that reason, the number of the optical parts can be reduced, and it is possible to increase a latitude in layout in a peripheral area of the cell 101.

In this embodiment, the first mirror 104a may preferably be brought close to the cell 101 in order that the apparatus has as small a footprint as possible.

The first mirror 104a is disposed so that its mirror surface crosses with the optical axis of the pump light source 102 at right angles. The optical path of the probe beam 107 is parallel to the mirror surface of the first mirror 104a.

The pump beam 106 which has passed through the cell 101 is reflected by the first mirror 104a to pass through the cell 101 again. In the atomic magnetometer of this embodiment, by reciprocating the optical path of the pump beam 106 similarly as in the preceding embodiments, it is possible to enhance the spin polarization degree of the atomic group.

The pump beam 106 is divergent light, so that there is a beam which is not perpendicular to the probe beam 107. The influence of such non-orthogonality is canceled by reflecting the pump beam 106 by the first mirror 104a as described in connection with the First Embodiment. Therefore, the residual magnetic field in the cell 101 can be easily canceled.

Further, the area of the spin-polarized atomic group is expanded, so that the detection sensitivity of the atomic magnetometer is improved.

Further, the influence of non-orthogonality between the pump beam and the probe beam, due to non-uniform expanse of the pump beam by a laser with an improper mode, on a signal can be automatically canceled, so that the effect that the magnetic field in the measurement area is easily changed to a zero magnetic field can also be achieved.

Further, similarly as in Embodiment 1, the magnetic shield box, the Helmholtz coils for compensating for the magnetic field, the oven for heating an inner portion of the cell, and the heat insulating layer are provided to prepare the atomic magnetometer.

Embodiment 4

Figure 11:
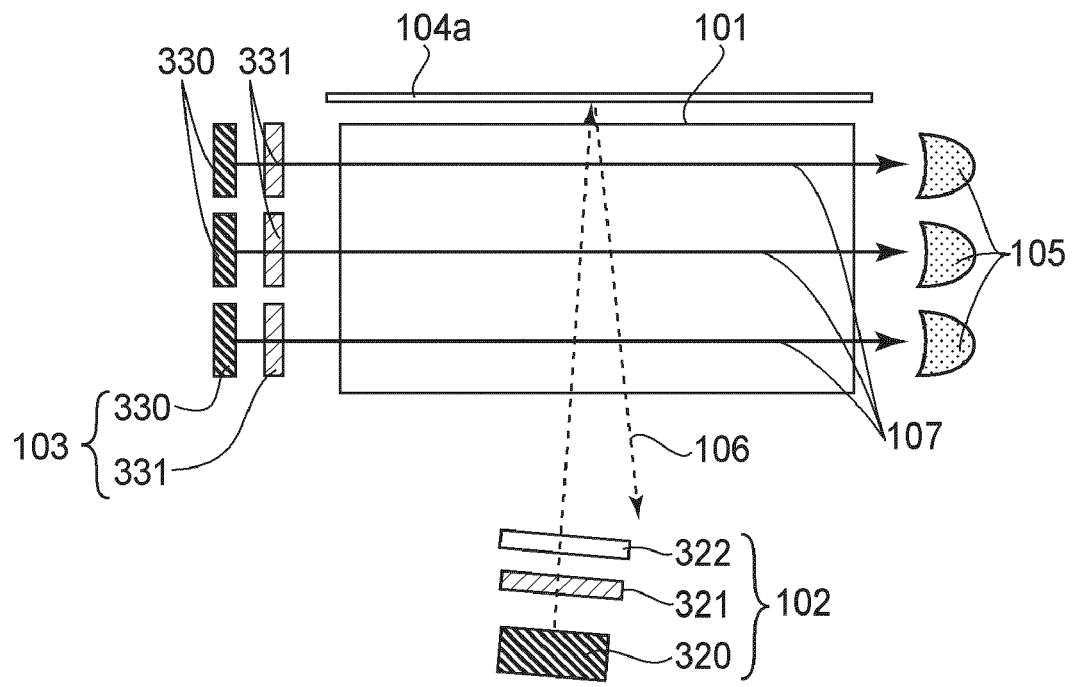

FIG. 11 is a schematic sectional view for illustrating an optical atomic magnetometer according to this embodiment.

The atomic magnetometer of this embodiment includes the cell 101 containing the atomic group, the pump light source 102, the probe light source 103, the first mirror 104a, and the detector 105.

Referring to FIG. 11, three probe light source 103 and three detectors 105 are disposed but the atomic magnetometer of this embodiment may include a plurality of probe light sources like source 103 and a plurality of detectors like detector 105.

The cell 101 is disposed between the pump light source 102 and the first mirror 104a and between the probe light source 103 and the detector 105. The optical axis of each of the plurality of probe light source 103 is disposed parallel to the mirror surface of the first mirror 104a. The first mirror 104a may desirably be a multilayer dielectric mirror in order to reduce the magnetic noise.

The pump light source 102 includes a laser light source 320, Glan-Thompson prism 321, and a quarter-wave plate 322. The laser light emitted from the laser light source 320 passes through the Glan-Thompson prism 321 and the quarter-wave plate 322 in this order to be converted into circularly polarized light.

Each of the probe light sources 103 includes a laser light source 330 and Glan-Thompson prism 331. The laser light emitted from the laser light source 330 passes through the Glan-Thompson prism 331 to be converted into linearly polarized light.

The pump beam 106 which has passed through the cell 101 is reflected by the first mirror to pass through the cell 101 again.

The optical paths of the probe beams 107 emitted from the plurality of the probe light source 103 cross the optical path of the pump beam 106 in different areas. Each of the probe beams 107, having passed through the cell 101, enters an associated detector 105. As a result, the magnetic field can be measured in various areas.

As the detectors 105, similarly as in FIG. 1, it is possible to use a balance-type polarimeter, a crossed Nicol-type polarimeter, or the like.

Further, similarly as in Embodiment 1, the magnetic shield box 303, the Helmholtz coils for compensating for the magnetic field, the oven 301 for heating an inner portion of the cell 101, and the heat insulating layer 302 are provided to prepare the atomic magnetometer.

The atomic magnetometer of this embodiment can measure the magnetic field applied in the plurality of areas in the cell 101, i.e., a distribution of the magnetic field.

Further, similarly as in Embodiment 1, the spin polarization degree of the atomic group can be enhanced and it is also possible to cancel the influence of the non-orthogonality between the pump beam 106 and the probe beam 107. Therefore, detection sensitivity of the magnetic field is improved.

Also, in the atomic magnetometer of this embodiment, similarly as in Embodiment 2, the pump beam 106 may pass through the cell 101 plural times. Further, similarly as in Embodiment 3, the pump beam 106 may also be divergent light.

Second Embodiment

Figure 12:
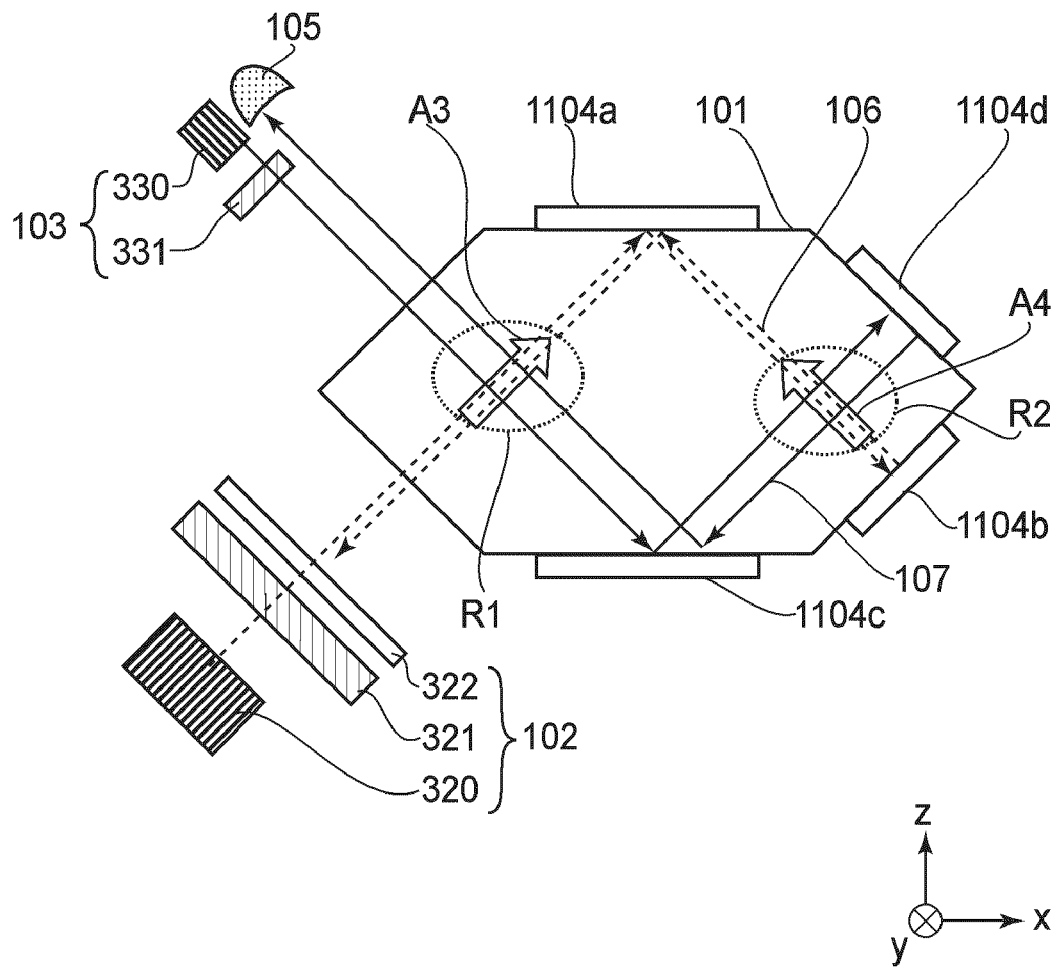

FIG. 12 is a schematic sectional view for illustrating an optical atomic magnetometer according to this embodiment.

The atomic magnetometer of this embodiment includes the cell 101 containing the atomic group, the pump light source 102, the probe light source 103, and the detector 105. Further, the atomic magnetometer further includes first to fourth mirrors 1104a, 1104b, 1104c and 1104d.

The pump light source 102 includes a laser light source 320, Glan-Thompson prism 321, and a quarter-wave plate 322. The laser light emitted from the laser light source 320 passes through the Glan-Thompson prism 321 and the quarter-wave plate 322 in this order to be converted into circularly polarized light.

The probe light source 103 includes a laser light source 330 and Glan-Thompson prism 331. The laser light emitted from the laser light source 330 passes through the Glan-Thompson prism 331 to be converted into linearly polarized light.

The cell 101 has a hexagonal column shape and has a hexagonal shape in a plane through which the pump beam 106 and the probe beam 107 pass. From one surface of six side surfaces constituting the hexagonal column shape, the pump beam 106 enters the cell 101.

From another surface, the probe beam 107 enters the cell 101. The incident surface of the pump beam 106 is adjacent to the incident surface of the probe beam 107.

At the remaining four surfaces constituting an outer wall of the cell 101, the mirrors 1104a to 1104d are provided.

From the incident surface of the pump beam 106, the incident surface of the probe beam 107, the first mirror 1104a, the fourth mirror 1104d, the second mirror 1104b, and the third mirror 1104c are located clockwise in this order.

These mirrors 1104a, 1104b, 1104c and 1104d may desirably be the multilayer dielectric mirror. The multilayer dielectric mirror can be directly formed on the outer wall of the cell 101.

The first mirror 1104a is disposed parallel to the third mirror 1104c. The detector 105 is disposed closely to the probe light source 103.

The pump beam 106 passes through an area R1 (FIG. 12) in the cell 101 and is incident on the first mirror 1104a at an incident angle of 45 degrees. The pump beam 106 reflected by the first mirror 1104a passes through another area P2 (FIG. 12) in the cell 101 and is vertically incident on the second mirror 1104b.

The pump beam 106 reflected by the second mirror 1104b passes through the area R2 again and is incident on the first mirror 1104a. Then, the pump beam 106 passes through the area R1 again.

In the case where the pump beam 106 in the right-hand circularly polarized light, the atomic group in the area R1 in spin-polarized in a direction of an arrow A3 shown in FIG. 12. Further, the atomic group in the area R2 is spin-polarized in a direction of an arrow A4 shown in FIG. 12.

The pump beams 106 before and after the reflection by the second mirror 1104b propagate along substantially the same optical path in directions opposite to each other. Therefore, the pump beams 106 before and after the reflection spin-polarize the atomic group in the same direction. This can be considered similarly as in the First Embodiment.

The probe beam 107, having entered the cell 101, passes through the area R1 in the cell 101 and is then incident on the third mirror 1104c at an incident angle of 45 degrees. The probe beam 107 reflected by the third mirror 1104c passes through the area R2 and then is vertically incident on the fourth mirror 1104d.

The probe beam 107 reflected by the fourth mirror 1104d passes through the area R2 again and is incident on the third mirror 1103c again. Then, the probe beam 107 passes through the area R1 again and thereafter enters the detector 105.

In the area R1 and the area R2, the optical path of the probe beam 107 crosses with the optical path of the pump beam 106 at right angles. The spin polarization direction in the area R1 forms an angle of 90 degrees counterclockwise from the propagation direction of the probe beam 107. Similarly, the spin polarization direction in the area R2 forms an angle of 90 degrees counterclockwise from the propagation direction of the probe beam 107.

The probe beam 107 rotates its polarization plane in the area R1 depending on a magnitude of the measurement magnetic field. Then, the probe beam 107 reflected by the third mirror 1103c reverses a rotation angle of the polarization plane.

For example, assuming that the probe beam 107 includes linearly polarized light directed in a direction (the y-direction in FIG. 12) perpendicular to the incident surface and that the polarization plane is rotated an angle of $+\theta_1$ counterclockwise in the area R1, the probe beam 107 reflected by the mirror is linearly polarized light with the polarization plane rotated an angle of $-\theta_1$ from the y-direction.

In the case where the probe beam 107 is reflected by the mirror, when the probe beam 107 is viewed from an observer at rest, an oscillating direction of the electric field is not changed. However, the propagation direction of the probe beam 107 is changed, so that the polarization plane of the probe beam 107 after the reflection is inclined by the angle of $-\theta_1$.

The atomic groups in the areas R1 and R2 are spin-polarized in the same direction on the basis of the propagation direction of the probe beam 107. Therefore, when the directions of the measurement magnetic fields in the areas R1 and R2 are the same direction, the polarization plane of the probe beam 107 is rotated counterclockwise in the area R2. When the rotation angle at this time is $+\theta_2$, the rotation angle of the polarization plane of the probe beam 107 immediately before the incidence on the fourth mirror 1104d is $-\theta_1+\theta_2$.

That is, in the case where the measurement magnetic fields in the same direction are applied in the two areas R1 and R2, the polarization planes of the probe beam 107 are rotated in opposite directions.

The rotation angle of the polarization plane of the probe beam 107 reflected by the fourth mirror 1104d is reversed into $+\theta_1-\theta_2$. Thereafter, when the probe beam 107 passes through the area R2 again, the polarization plane is rotated counterclockwise by $-\theta_2$. This is because the spin polarization direction of the atomic group in the area R2 is reversed on the basis of the propagation direction of the probe beam 107 reflected by the fourth mirror 1104d.

Thereafter, the rotation angle of the polarization plane of the probe beam 107 is reversed again by the third mirror 1103c into $-\theta_1+2\times\theta_2$. Finally, the polarization plane of the probe beam 107 is rotated by $-\theta_1$ when the probe beam 107 passes through the area R1.

The Faraday rotation angle of the probe beam 107 immediately before the incidence on the detector 105 is $2\times(\theta_2-\theta_1)$ in total.

As described above, the total Faraday rotation angle reflects the difference in measurement magnetic field as between the area R1 and the area R2. That is, by detecting this Faraday rotation angle by means of the detector 105 described in Embodiment 1, it is possible to measure the difference in magnetic field between the areas R1 and R2.

Thus, the atomic magnetometer of this embodiment functions as a magnetic gradiometer.

In this embodiment, it is not necessary to provide the fourth mirror 1104d. Also in this case, the atomic magnetometer functions as the magnetic gradiometer.

In the case of providing the fourth mirror 1104d, compared with the case of absence of the fourth mirror 1104d, the Faraday rotation angle doubles. Therefore, the sensitivity of the atomic magnetometer as a magnetic gradiometer can be improved.

In this embodiment, the incident angle of the pump beam 106 on the first mirror 1104a is 45 degrees but may also be any angle so long as the incident angle is not zero degrees. In this case, in area R1, it is preferable that the optical path of the probe beam 107 crosses with the pump beam 106 at right angles.

The magnetic force measuring method of the present invention can be carried out by employing the atomic magnetometers described above in the First and Second Embodiments and Embodiments 1 to 4. That is, in the magnetic force measuring method of the present invention, the atomic magnetometer according to the above-described Embodiments is prepared and the pump beam is reflected by the mirror to pass through the cell plural times in total. Then, the probe beam may cross the pump beam in the cell and then is only required to enter the detector.

The above-described atomic magnetometer of the present invention is applicable to measurement of a minute magnetic field such as an intracerebral magnetic field, a magnetometer for magnetic field detection in an MRI (magnetic resonance imaging) apparatus, and the like.

In the present invention, the pump beam 106 is not necessarily complete circularly polarized light but may also include a circularly polarized light component so as to spin-polarize the atomic group. Further, the probe beam 107 is not necessarily complete linearly polarized light but may also include a linearly polarized light component so as to permit measurement of the rotation angle of the polarization plane thereof.

In the above-described Embodiments, the optical path of the probe beam 107 is in the incident surface of the pump beam 106. However, the probe beam 107 may also enter the cell 101 with respect to the direction perpendicular to the incident surface of the pump beam 106. In this case, the detector 105 may be disposed on the optical path of the probe beam 107 which has passed through the cell 101. In this case, the measurement magnetic field directed in a direction perpendicular to both of the optical paths of the pump beam and the probe beam.

The atomic magnetometer according to the present invention can also be considered to be an optical pumping magnetometer.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 081278/2008 filed Mar. 26, 2008, which is hereby incorporated by reference.

What is claimed is:
1. An atomic magnetometer comprising:
a cell containing an atomic group;

a light source for emitting a probe beam including linearly polarized light so that the probe beam passes through said cell;

a detector for detecting a rotation angle of a polarization plane of the probe beam which has passed through said cell;

a light source for emitting a pump beam for spin polarizing a plurality of atoms constituting the atomic group so that the pump beam crosses an optical path of the probe beam in said cell; and a first mirror for reflecting the pump beam so that the pump beam which has passed through said cell again crosses the optical path of the probe beam in said cell.

2. A magnetometer according to claim 1, wherein said first mirror is disposed in parallel with the optical path of the probe beam.

3. A magnetometer according to claim 1, further comprising a second mirror for reflecting the pump beam which has passed through said cell after being reflected by said first mirror, so that the pump beam crosses again the optical path of the probe beam, wherein said second mirror is disposed parallel to said first mirror.

4. A magnetometer according to claim 3, wherein said detector is configured to detect the rotation angle of the polarization plane of the probe beam which has passed through said cell an even number of times.

5. A magnetometer according to claim 1, wherein the optical path of the probe beam is in a plane of incidence of the pump beam.

6. A magnetometer according to claim 1, wherein the optical path of the probe beam is perpendicular to a plane of incidence of the pump beam.

7. A magnetometer according to claim 1, wherein said light source for emitting the pump beam emits the pump beam so that the pump beam crosses the optical path of the probe beam at right angles.

8. A magnetometer according to claim 1, wherein said light source for emitting the probe beam comprises a plurality of light source portions for emitting probe beams and said detector comprises a plurality of detector portions, and wherein optical paths of the probe beams emitted from the plurality of light source portions for emitting probe beams cross an optical path of the pump beam in different areas in said cell.

9. A magnetometer according to claim 1, wherein said first mirror is a dielectric multilayer mirror.

10. A magnetometer according to claim 3, wherein said second mirror is a dielectric multilayer mirror.

11. An atomic magnetometer comprising:

a cell containing an atomic group;

a light source for emitting a probe beam including linearly polarized light so that the probe beam passes through said cell;

a detector for detecting a rotation angle of a polarization plane of the probe beam which has passed through said cell;

a light source for emitting a pump beam for spin polarizing a plurality of atoms constituting the atomic group so that the pump beam crosses an optical path of the probe beam in an area in said cell;

a first mirror for reflecting the pump beam so that the pump beam which has passed through said cell crosses again the optical path of the probe beam in another area in said cell;

a second mirror provided so that the pump beam which has passed through said cell after being reflected by said first mirror is vertically incident on said second mirror; and a third mirror for reflecting the probe beam so that the probe beam which has passed through said cell after being reflected by said first mirror passes again through said cell.

12. A magnetometer according to claim 11, further comprising a fourth mirror provided so that the probe beam which has passed through said cell after being reflected by said third mirror is vertically incident on said fourth mirror.

13. A magnetometer according to claim 11, wherein the optical path of the probe beam crosses an optical path of the pump beam at right angles.

14. A magnetic force measuring method comprising the steps of:

preparing an atomic magnetometer including a cell containing an atomic group, a light source for emitting a pump beam for spin polarizing a plurality of atoms constituting the atomic group, a light source for emitting a probe beam including linearly polarized light, a detector for detecting a rotation angle of a polarization plane of the probe beam, and at least one mirror placed in an optical path of the pump beam; and passing the pump beam through the cell plural times by reflecting the pump beam by using the at least one mirror so that the probe beam crosses the pump beam in the cell and then enters the detector.

15. A magnetic force measuring method for measuring a rotation angle of a polarization plane of a probe beam by irradiating an atomic group contained in a hollow portion of a cell with a pump beam to uniformize directions of spin of atoms constituting the atomic group and then by irradiating the spin polarized atomic group of the atoms with linearly polarized light as the probe beam, said magnetic force measuring method comprising the steps of:

passing the pump beam through the cell at least two times by reflecting the pump beam which has passed through the cell so that the probe beam crosses the pump beam in the cell at least two times; and detecting the rotation angle of the polarization plane of the probe beam which has passed through the cell.

16. An atomic magnetometer for carrying out a magnetic force measuring method according to claim 15, comprising:

a light source for outputting a probe beam;

a light source for outputting a pump beam;

a mirror for folding an optical path of the probe beam; and a detector for detecting a rotation angle of a polarization plane of the probe beam.

* * * * *